United States Patent [19]

Ando et al.

[11] Patent Number: 4,900,970
[45] Date of Patent: Feb. 13, 1990

[54] ENERGY-TRAPPING-TYPE PIEZOELECTRIC RESONANCE DEVICE

[75] Inventors: Akira Ando; Toshihiko Kittaka; Yukio Sakabe; Satoru Fujishima, all of Kyoto, Japan

[73] Assignee: Murata Manufacturing Co., Ltd., Japan

[21] Appl. No.: 215,549

[22] Filed: Jul. 6, 1988

[30] Foreign Application Priority Data

Jul. 6, 1987 [JP] Japan .................. 62-168491

[51] Int. Cl.$^4$ .......................................... H01L 41/08
[52] U.S. Cl. ................................. 310/320; 310/358; 310/359; 310/366
[58] Field of Search ............... 310/320, 359, 366, 358

[56] References Cited

U.S. PATENT DOCUMENTS

| | | | |
|---|---|---|---|
| 3,433,982 | 3/1969 | Kaname et al. | 310/366 X |
| 3,590,287 | 6/1971 | Berlincourt et al. | 310/366 X |
| 4,087,716 | 5/1978 | Heywang | 310/359 X |
| 4,564,782 | 1/1986 | Ogawa | 310/366 X |
| 4,649,313 | 3/1987 | Ogawa et al. | 310/358 |
| 4,652,784 | 3/1987 | Inoue et al. | 310/320 |
| 4,742,264 | 5/1988 | Ogawa | 310/359 X |

FOREIGN PATENT DOCUMENTS 0176805 4/1986 European Pat. Off. ............ 310/320

Primary Examiner—Mark O. Budd
Attorney, Agent, or Firm—Ostrolenk, Faber, Gerb & Soffen

[57] ABSTRACT

An energy trapping type piezoelectric resonance device utilizing the mode of thickness extensional vibration comprises a plate-shaped body of a piezoelectric material and three or more electrodes provided to be opposed to each other through peizoelectric material layers in the direction of thickness of the body. At least one of the electrodes is provided to be smaller in area than the major surfaces of the body, to be capable of energy trapping.

10 Claims, 5 Drawing Sheets

ENERGY-TRAPPING-TYPE PIEZOELECTRIC RESONANCE DEVICE

BACKGROUND OF THE INVENTION

1. Field of the Invention

The present invention relates to an energy-trapping type piezoelectric resonance device, and more particularly, it relates to an energy-trapping-type piezoelectric resonance device utilizing the mode of thickness-extensional vibration.

2. Description of the Prior Art

U.S. Pat. No. 3,384,768 discloses an energy trapping type piezoelectric-resonator utilizing the mode of thickness extensional vibration, which is prepared by lead zirconate titanate (PZT) piezoelectric ceramics. As shown in present FIG. 2, such an energy-trapping-type piezoelectric-resonator is formed of a piezoelectric ceramic 21 and electrodes 22 and 23 on middle parts of both surfaces thereof. The piezoelectric ceramic 21 is prepared from a material such as PZT piezoelectric ceramic, which has an effective Poisson's ratio of at least $\frac{1}{3}$. Utilizing a material having an effective Poisson's ratio of less than $\frac{1}{3}$, it is impossible to obtain a frequency-lowering-type of energy trapping piezoelectric-resonance device.

As to the aforementioned piezoelectric-resonator, a demand exists for an improvement for higher frequency use. In order to vibrate such a piezoelectric-resonator in a higher frequency range, the piezoelectric ceramic 21 may be reduced in thickness. However, the lower limit of such thickness is about 200 $\mu$m in view of handling, and it is difficult to further reduce the thickness in practice. Thus, an actual frequency range of thickness extensional fundamental vibration has been not more than 10 MHz.

On the other hand, it may be possible to use a piezoelectric-resonator in a higher frequency range by utilizing the third harmonic of thickness-extensional vibration. However, the third harmonic is considerably lower in response level as compared with fundamental vibration. Thus, the third harmonic has been restricted to specific use.

Further, in a conventional piezoelectric resonance device utilizing the mode of thickness-extensional fundamental vibration, it has been impossible to trap energy by using a frequency-lowering method unless the material therefor has an effective Poisson's ratio of at least $\frac{1}{3}$, as hereinabove described. Thus, the useful materials has been limited.

As to lead-zirconate-titanate ceramics well known as a piezoelectric material, a composition for enabling energy trapping of thickness-extensional fundamental vibration with an effective Poisson's ratio of at least $\frac{1}{3}$ must be near the phase boundary between a tetragonal phase and a rhombohedral phase. Thus, it has been impossible to obtain a device having a low dielectric constant suitable for use in a high frequency range, and the conventional device has been inferior in temperature stability.

SUMMARY OF THE INVENTION

An object of the present invention is to provide a piezoelectric resonance device that can be used in a higher frequency range.

Another object of the present invention is to provide a piezoelectric resonance device having structure capable of utilizing a piezoelectric material selected from a wider range.

According to the present invention, there is provided an energy-trapping-type piezoelectric resonance device utilizing the mode of thickness-extensional vibration. This device comprises a plate-shaped body of a piezoelectric material and three or more electrodes provided to be opposed to each other through layers of the piezoelectric material in the direction of thickness of the body. At least one of the electrodes is smaller in area than the major surfaces of the body, to be capable of energy trapping.

According to the present invention, three or more electrodes are provided to be opposed to each other through the piezoelectric material layers in the direction of thickness. Therefore, the frequency of primary mode of thickness extensional vibration appears on (n-1) times higher than that of a conventional single-plate-type piezoelectric resonance device (where n represents the number of electrodes, assuming that the devices are identical in entire thickness to each other). Thus, it is possible to obtain a piezoelectric resonance device which can be used in a higher frequency range.

Further, since three or more electrodes are provided to be opposed to each other through the piezoelectric material layers in the direction of thickness, energy of thickness-extensional vibration can be trapped even if the device is made from a piezoelectric material having an effective Poisson's ratio of less than $\frac{1}{3}$.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
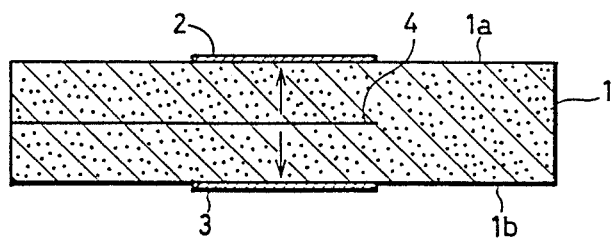
FIG. 1 is a sectional view showing an embodiment of the present invention.

FIG. 1 shows an embodiment of the present invention. Referring to FIG. 1, an energy-trapping-type piezoelectric resonance device utilizing the mode of thickness extensional vibration comprises a plate-shaped body 1 of a piezoelectric material and electrodes 2 and 3 provided on both major surfaces 1a and 1b thereof. The electrodes 2 and 3 are provided to be smaller in area than the major surfaces 1a and 1b; i.e., to reach edges of the body 1. An electrode 4 is provided at the center of the thickness of the body 1, to be opposed to the electrodes 2 and 3. Thus, this embodiment has three electrodes 2 to 4, which are opposed to each other in the direction of thickness through piezoelectric material layers, respectively.

The piezoelectric material layer between the electrodes 2 and 4 and that between the electrodes 3 and 4 are polarized in directions shown by arrows in FIG. 1, respectively.

Figure 3:
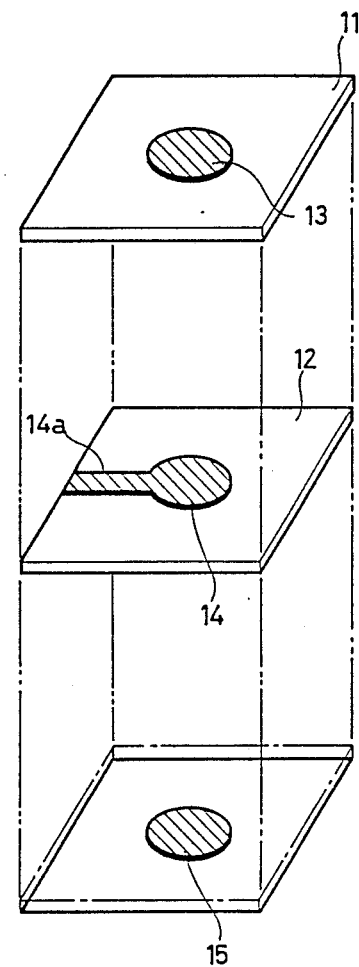
FIG. 3 is a perspective view showing ceramic green sheets and patterns of electrode paste for manufacturing the embodiment as shown in FIG. 1.

The embodiment as shown in FIG. 1 can be obtained through two ceramic green sheets 11 and 12 as shown in FIG. 3, for example. An electrode paste 13 for forming the electrode 2 is applied to the center of one major surface of the ceramic green sheet 11. Another electrode paste 14 for forming the electrode 4 is applied to one major surface of the ceramic green sheet 12. This electrode paste 14 has an extended portion 14a reaching one edge of the ceramic green sheet 12. This extended portion 14a is adapted to apply voltage to the electrode 4 (see FIG. 1) in polarization or driving.

On the other hand, an electrode paste 15 is applied to the other surface of the ceramic green sheet 12 as shown in a perspective manner in the lower part of FIG. 3. This electrode paste 15 is adapted to form the electrode 3. The ceramic green sheets 11 and 12 as shown in FIG. 3 are superposed in the shown state, stacked with each other under pressure, and then cofired. After that, a positive potential is applied to the electrode 4 and negative potentials are applied to the electrodes 2 and 3 in the state as shown in FIG. 1, to polarize the piezoelectric material layers in the directions as shown by arrows in the figure.

Description is now made on operation of the embodiment as shown in FIG. 1. An alternating field is applied between the electrodes 2 and 3 to drive the same. The electrodes 2 and 3 are smaller in area than the major surfaces 1a and 1b of the piezoelectric body 1 to be capable of energy trapping, whereby energy of thickness extensional vibration is trapped.

Figure 2:
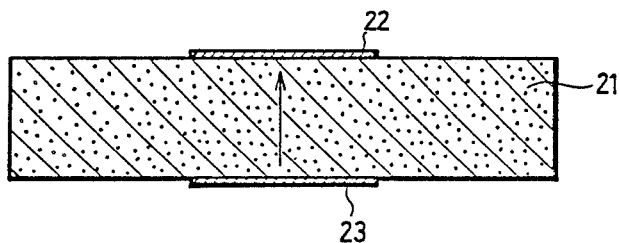
FIG. 2 is a sectional view showing a conventional piezoelectric resonance device.
Figure 4:
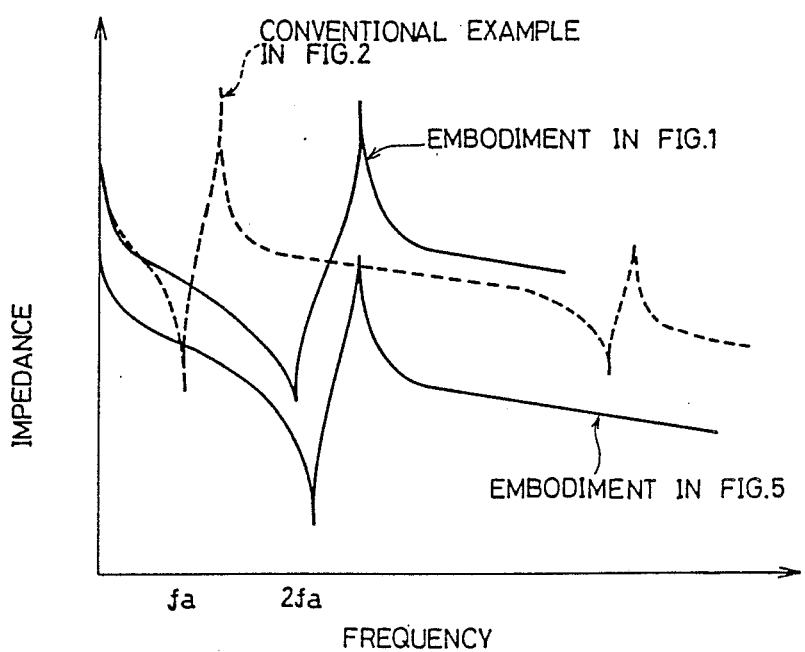
FIG. 4, illustrates impedance-frequency characteristics of the embodiment as shown in FIG. 1 and of the prior art.

FIG. 4 shows the impedance-frequency characteristic of this embodiment. FIG. 4 also shows the impedance-frequency characteristic of the conventional single-plate-type piezoelectric-resonance device as shown in FIG. 2, having the same thickness, by a broken line. It is understood from FIG. 4 that resonance and antiresonance frequency of the primary mode of thickness extensional vibration in the embodiment are higher than those of the conventional type as shown in FIG. 1. This is because such mode of thickness-extensional vibration is generated in the embodiment as shown in FIG. 1 that the distance between the electrodes 2 and 4 or 3 and 4 is $\lambda/2$, i.e., half the wavelength $\lambda$, while such fundamental mode of thickness-extensional vibration is generated in the prior art example as shown in FIG. 2 that the distance between the electrodes 22 and 23 is $\lambda/2$. Namely, assuming that the devices as shown in FIGS. 1 and 2 are identical in entire thickness to each other, second harmonic vibration is generated in the device of FIG. 1. Therefore, the frequency of primary resonance and antiresonance of thickness-extensional vibration are higher than those of the conventional type as shown in FIG. 4.

Thus, by providing the three electrodes 2 to 4 as shown in FIG. 1, such a piezoelectric-resonance device can be used in a higher frequency range while retaining the same thickness as a conventional type.

In the embodiment shown in FIG. 1, a piezoelectric-resonator of a higher harmonic, for example the sixth harmonic, can be obtained, by utilizing the mode of vibration at a three times higher frequency than that of the primary mode, for example the second harmonic.

Figure 5:
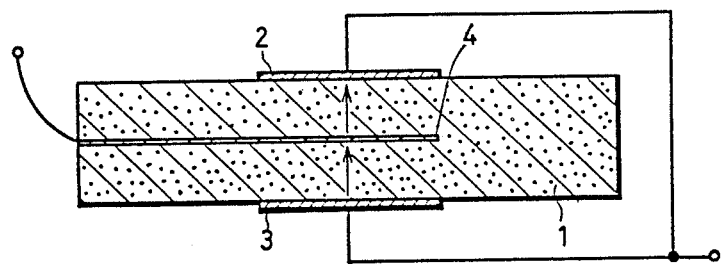
FIGS. 5 to 11 are sectional views showing second to eighth embodiments of the present invention, respectively.

OTHER EMBODIMENTS (a) A resonance device as shown in FIG. 5 is in accordance with the present invention. Referring to FIG. 5, piezoelectric material layers provided on and under an electrode 4 are polarized in the same direction as shown by arrows in the figure. Thus, electrodes 2 and 3 are equalized in potential to each other and an alternating field is applied between the same and the electrode 4, to implement a piezoelectric resonance device that can be used in a higher frequency range similarly to the embodiment as shown in FIG. 1. In the embodiment as shown in FIG. 5, impedance, can be reduced as compared with the embodiment of FIG. 1.

Figure 6:
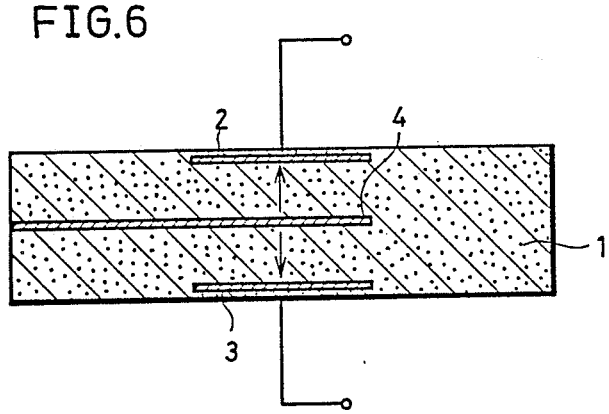

(b) A resonance device as shown in FIG. 6 is also in accordance with the present invention. Referring to FIG. 6, outermost electrodes 2 and 3 within a plurality of overlapping electrodes 2 to 4 are embedded in a body 1 of a piezoelectric material. Other points of this embodiment are similar to those of the embodiment as shown in FIG. 1, and hence redundant description is omitted. As understood from the embodiment shown in FIG. 6, energy of thickness extensional vibration can be trapped similarly to the embodiment as shown in FIG. 1 even if one or both of outermost electrodes are embedded in the body 1.

Figure 7:
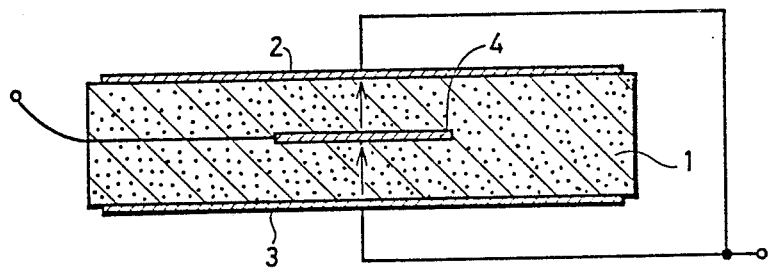
Figure 8:
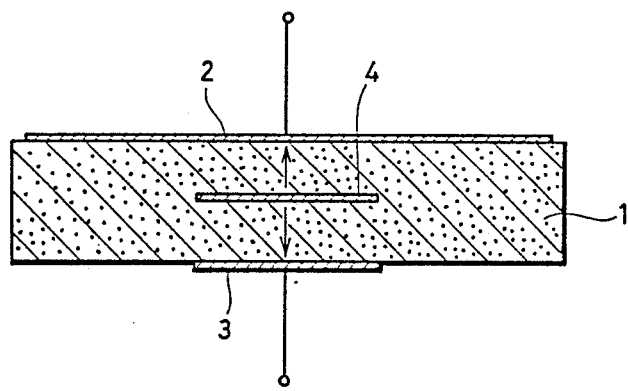
Figure 9:
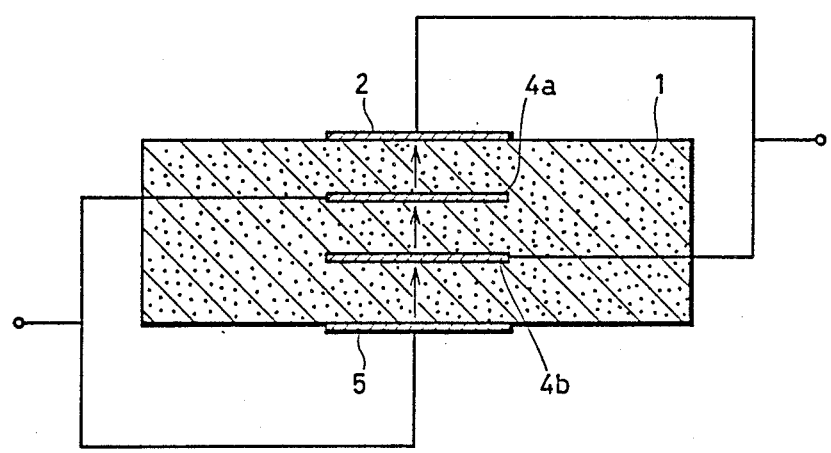
Figure 10:
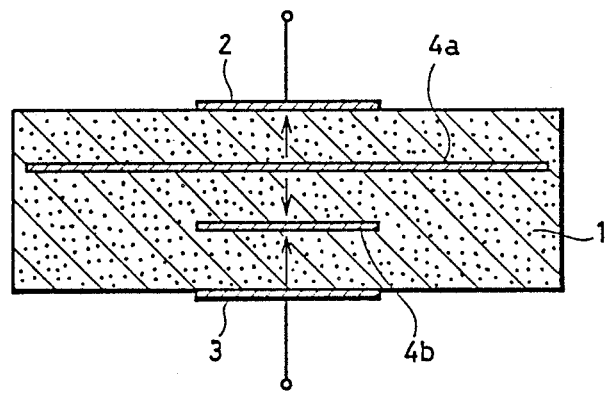
Figure 11:
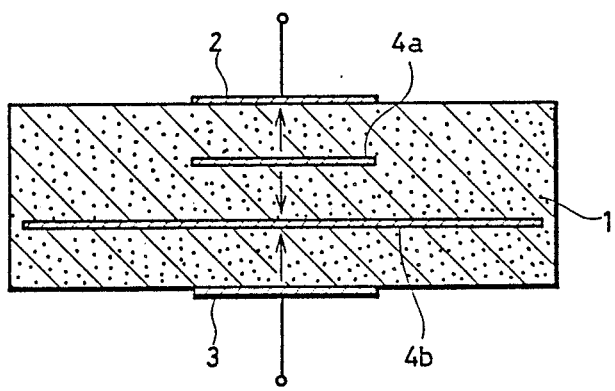

(c) Resonance devices as shown in FIGS. 7 to 11, illustrating different embodiments respectively, are also in accordance with the present invention. Referring to FIGS. 7 to 11, parts corresponding to those in FIG. 1 are indicated by the same reference-numerals. In the embodiments as shown in FIGS. 9 to 11, numerals 4a and 4b indicate inner electrodes, which are provided in a pair.

Each of FIGS. 7 to 11 shows an energy trapping type piezoelectric resonance device utilizing the mode of thickness-extensional vibration.

Each of FIGS. 7 and 8 shows a device of two-layer structure, which has at least one of electrodes 2 and 3 provided substantially over the entire major surfaces of a body 1 while an electrode 4 is provided only in a central portion of the body 1. While piezoelectric material layers are polarized in the same direction in FIG. 7, those in FIG. 8 are polarized in opposite directions as shown by arrows.

Each of FIGS. 9 to 11 shows an device of three-layer structure, which has piezoelectric-material layers polarized in directions shown by arrows. All of electrodes 2, 3, 4a and 4b are small-sized in the case of FIG. 9. Only an electrode 4a is large-sized in the case of FIG. 10. Only an electrode 4b is large-sized in the case of FIG. 11.

The function and effect of the present invention can also be attained by any of these embodiments, to implement a piezoelectric-resonance device that can be used in a higher frequency range as compared with a conventional single-plate type device.

(d) Although three or four electrodes are provided to be opposed to each other in each of the aforementioned embodiments, five or more electrodes may be opposed to each other through piezoelectric material layers, thereby to implement a piezoelectric resonance device that can be used in a higher frequency range.

(e) An electrode other than those, positioned on outermost layers, i.e., an inwardly provided electrode (e.g., the electrode 4) can be in the form of a full-face electrode to reach edges of the body 1 of a piezoelectric material dissimilarly to the outermost electrodes 2 and 3. When the inwardly-provided electrode is thus in the form of a full-face electrode, however, spurious output is caused. Therefore, the inwardly-provided electrode preferably has an area that is substantially equal to those of the outermost electrodes as in the aforementioned embodiments.

(f) Although a plurality of ceramic green sheets are prepared to be superposed and cofired in the method of manufacturing the embodiment as shown in FIG. 1, the present invention is not restricted to this. Sintered piezoelectric material sheets may be adhered to each other by an insulative binder to obtain a piezoelectric-resonance device according to the present invention. The material is not restricted to ceramics but also a monocrystal piezoelectric effect material, for example quartz, can be employed. Further, the device can be formed of a piezoelectric-crystal film of ZnO or the like by thin film formation technique such as sputtering or vacuum vapor deposition.

According to experiments made by the inventors, it has been recognized that energy of thickness-extensional vibration can be trapped by exciting harmonics even if a piezoelectric material such as $PbTiO_3$, $LiTaO_3$, $LiNbO_3$ or $Li_2B_4O_7$, having a Poisson's ratio of less than $\frac{1}{3}$ and being incapable of frequency-reduction-type energy trapping in thickness-extensional fundamental vibration, is employed in all of the aforementioned embodiments. Such a material is suitable for use in a high-frequency range since the same has better temperature stability and smaller dielectricity as compared with a lead zirconate titanate material. Thus, according to the present invention, an energy-trapping-type piezoelectric-resonance device responsive to various purposes can be attained by employing a piezoelectric material selected from a wider range.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An energy-trapping-by-frequency-lowering-type piezoelectric-resonance device utilizing the mode of thickness-extensional vibration, comprising:
    a plate-shaped body of a piezoelectric material having major surfaces; and
    three or more electrodes arranged opposed to each other in the direction of thickness of said body through layers of the piezoelectric material; and
    said electrodes being spaced apart from each other by an amount selected to result in resonance at a harmonic mode; and
    at least one of said electrodes being smaller in area than the major surfaces of said body, thereby to be capable of energy trapping by frequency lowering.

2. A piezoelectric-resonance device in accordance with claim 1, wherein:
    said piezoelectric-material layers between said electrodes are polarized in alternate directions, and
    outermost two of said three or more electrodes are to be employed in driving.

3. A piezoelectric-resonance device in accordance with claim 2, wherein:
    said piezoelectric material is one in which frequency-lowering-type energy trapping of the fundamental mode cannot be achieved.

4. A piezoelectric resonance device in accordance with claim 3, wherein:
    said piezoelectric material is selected from the group consisting of lead zirconate titanate, $PbTiO_3$, $LiTaO_3$, $LiNbO_3$ and $Li_2B_4O_7$.

5. A piezoelectric resonance device in accordance with claim 4, wherein:
    said electrodes are provided in an odd number of at least three, to suppress spurious output by utilizing an even order harmonic.

6. A piezoelectric resonance device in accordance with claim 1, wherein:
    said piezoelectric-material layers are polarized in the same direction,
    said three or more electrodes are divided into two electrode groups such that adjacent ones of said electrodes belong to different electrode groups while those belonging to the same electrode group are electrically connected with each other; and
    both of said electrode groups are supplied with voltage in driving.

7. A piezoelectric-resonance device in accordance with claim 6, wherein:
    said piezoelectric material is one in which frequency-lowering-type energy trapping of the fundamental mode cannot be achieved.

8. A piezoelectric resonance device in accordance with claim 7, wherein:
    said piezoelectric material is selected from the group consisting of lead zirconate titanate, $PbTiO_3$, $LiTaO_3$, $LiNbO_3$ and $Li_2B_4O_7$.

9. A piezoelectric resonance device in accordance with claim 8, wherein:
    said electrodes are provided in an odd number of at least three, to suppress spurious output by utilizing an even order harmonics.

10. A piezoelectric device in accordance with claim 1, wherein all of said layers of piezoelectric material are for being driven by respective voltages on said electrodes.

* * * * *